United States Patent [19]

Puerner

[11] Patent Number: 4,935,284
[45] Date of Patent: Jun. 19, 1990

[54] MOLDED CIRCUIT BOARD WITH BURIED CIRCUIT LAYER

[75] Inventor: Dean A. Puerner, Maricopa, Ariz.

[73] Assignee: AMP Incorporated, Harrisburg, Pa.

[21] Appl. No.: 287,764

[22] Filed: Dec. 21, 1988

[51] Int. Cl.$^5$ .................................................. B32B 3/00
[52] U.S. Cl. ........................................ 428/137; 428/192; 428/209; 428/411.1; 428/457; 428/901; 174/266; 361/397
[58] Field of Search ............. 428/192, 137, 209, 411.1, 428/457, 901; 174/68.5; 361/357

[56] References Cited

U.S. PATENT DOCUMENTS

| | | |
|---|---|---|
| 2,923,651 | 2/1960 | Petriello . |
| 3,052,823 | 9/1962 | Anderson et al. . |
| 3,184,830 | 5/1965 | Lane et al. . |
| 3,268,653 | 8/1966 | McNutt . |
| 3,398,232 | 8/1968 | Hoffman . |
| 3,400,210 | 9/1968 | Reimer . |
| 3,417,294 | 12/1968 | Steidlitz . |
| 4,240,198 | 12/1980 | Alonso . |
| 4,326,777 | 12/1980 | Merlina et al. . |
| 4,511,597 | 4/1985 | Teng et al. . |
| 4,600,971 | 7/1986 | Rose et al. . |
| 4,611,262 | 9/1986 | Galloway et al. . |
| 4,758,693 | 7/1988 | Hoffman . |
| 4,810,048 | 3/1989 | Asano et al. ............... 350/96.11 |

*Primary Examiner*—Patrick Ryan
*Attorney, Agent, or Firm*—Anton P. Ness

[57] ABSTRACT

A circuit substrate includes upper and lower plastic layers molded to upper and lower surfaces of a metal member without the use of bonding agent, with integral columns of plastic material extending through holes of the metal member and along peripheral edges thereof joining the plastic layers together at a plurality of locations. Circuit paths are plated onto major surfaces of the plastic layers. Certain circuit paths are electrically connected by plated via holes to the embedded metal layer, with a pair of column joints adjacent each plated via hole joining the plastic layers thereat to prevent local delamination from the metal layer during handling and preventing microcracks in the plating material. Plated through-holes joining opposed circuit paths and the embedded metal layer similarly have a pair of adjacent column joints. Electrically isolated plated through-holes extend through larger diameter holes in the embedded metal layer, with the plastic walls serving as column joints. One example of such a circuit substrate is a paddle board for use in a connector for ribbon cable. Another example includes a pair of metal layers for power bussing.

13 Claims, 4 Drawing Sheets

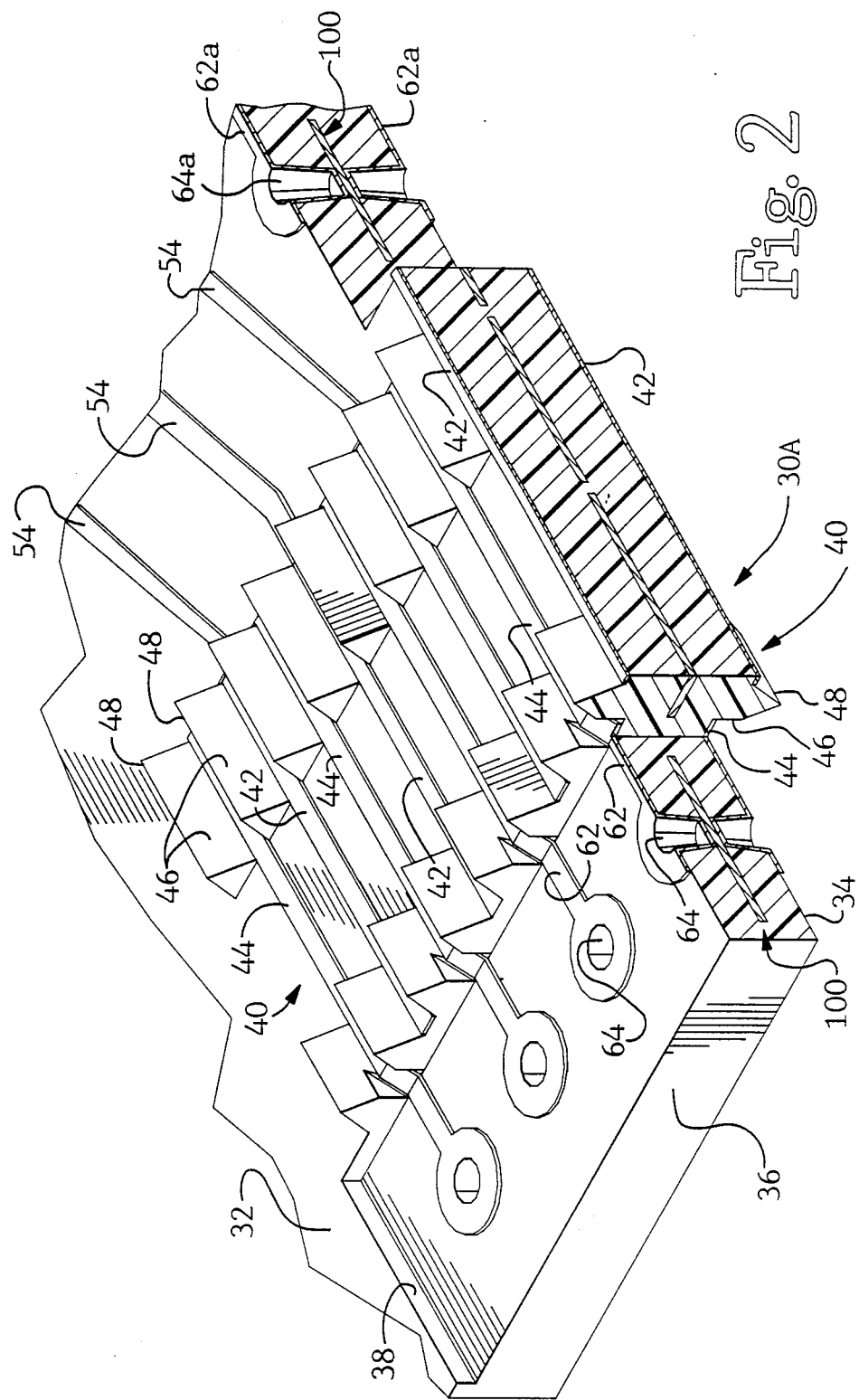

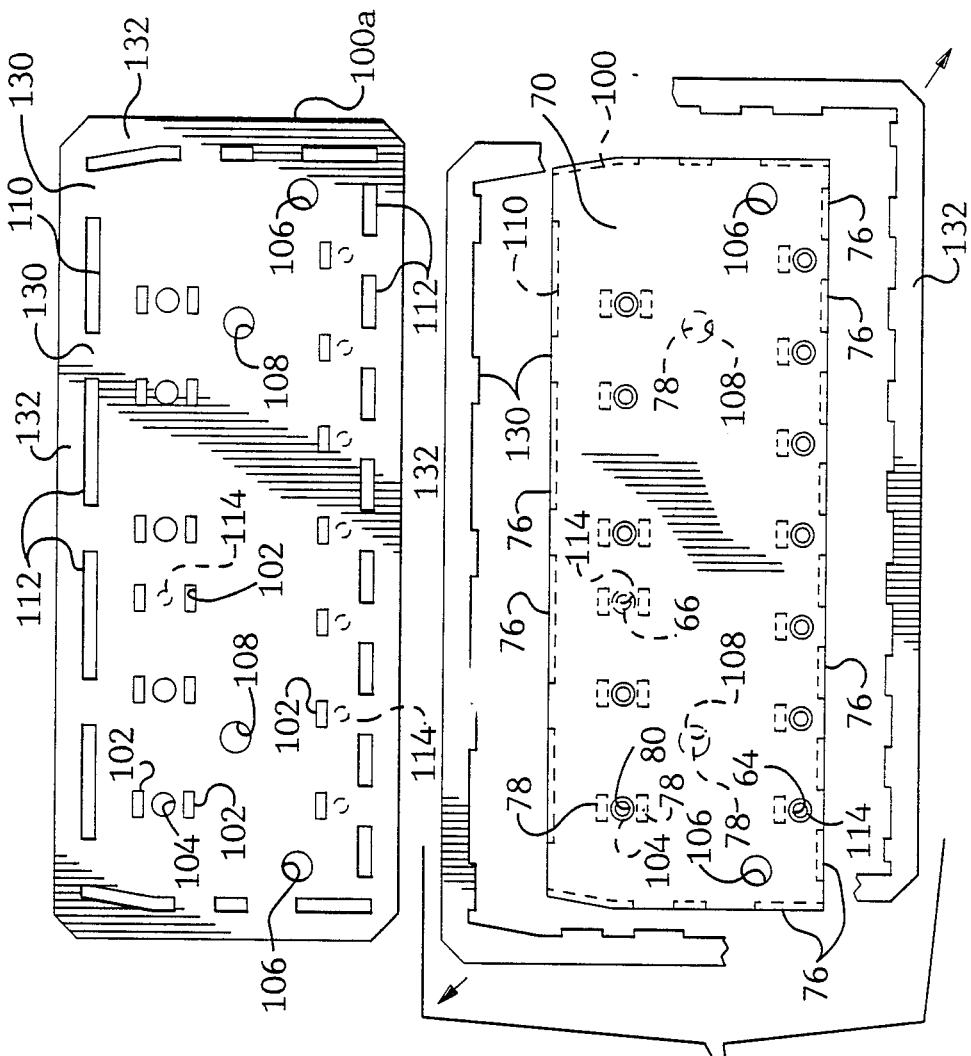

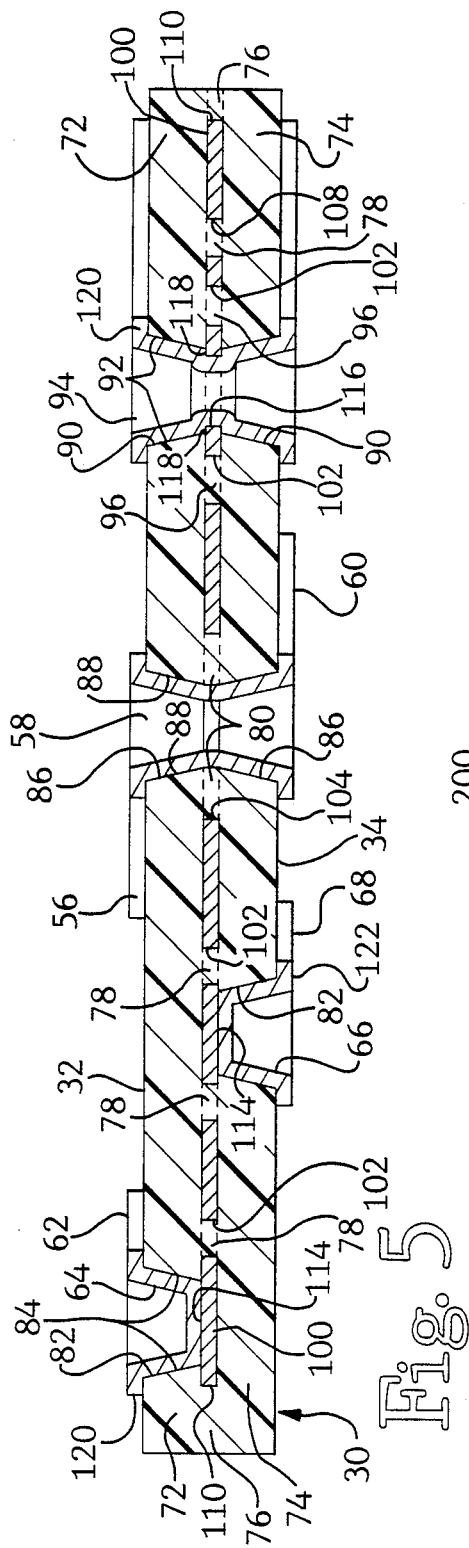
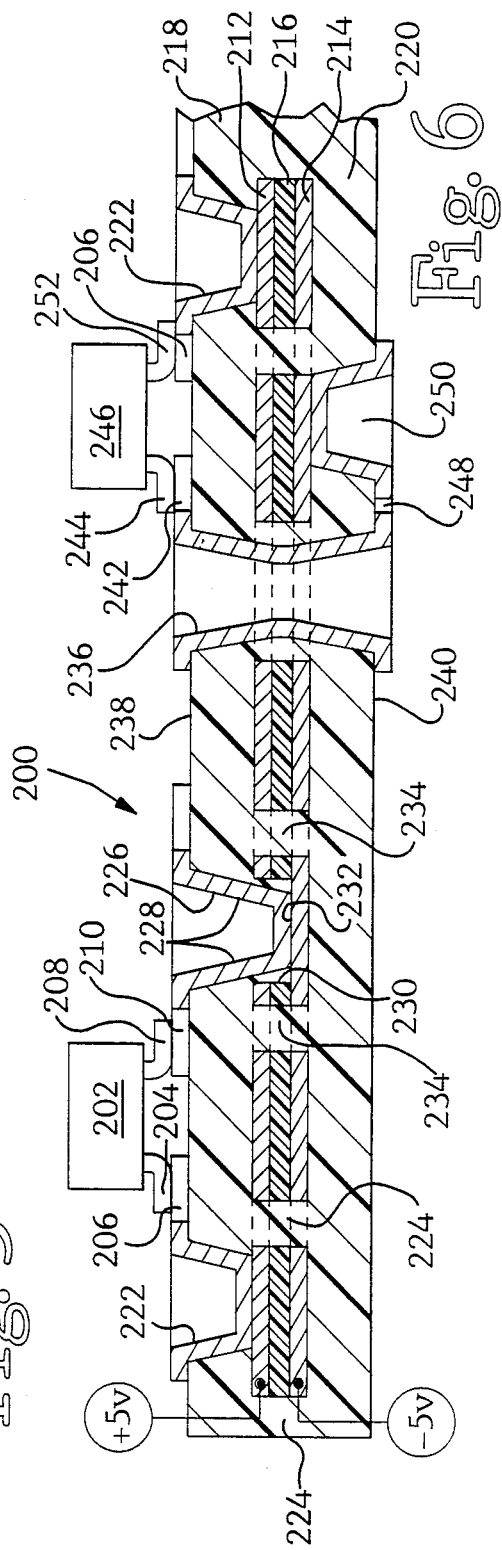

MOLDED CIRCUIT BOARD WITH BURIED CIRCUIT LAYER

FIELD OF THE INVENTION

The present invention is directed to the field of electrical connectors and more particularly to electrical circuit substrates requiring bussing means.

BACKGROUND OF THE INVENTION

Electrical substrates with circuits conventionally are printed circuit boards comprising fabricated dielectric substrates having planar surfaces upon which are etched an array of circuit paths. Certain printed circuit boards are known which are multilayer, in which a conductive layer (or layer of circuit paths) is embedded within the fabricated substrate to perform tasks such as conducting power or providing grounding without requiring surface area or real estate which is more efficiently used by circuit paths for signal transmission.

Recently substrates have begun to enter the market in which a molded plastic substrate has circuit paths plated thereonto after molding such as by catalyzing the surface, masking off areas of the catalyzed surface not desired to be conductive, exposing the nonmasked areas to actinic light such as ultraviolet and thereby activating the catalyst, conveying metal ions to the activated surface which are captured thereby, and then plating to the metal-containing areas a conductive layer of desired thickness by electroless plating or electroplating, or a combination thereof, resulting in a defined circuit pattern. The molding of the plastic substrate enables or facilitates creating integral structures or features on the substrate surface such as projections, recesses, grooves, holes, tapered surface portions and so on.

It is desired to provide a molded circuit substrate with an integral bussing means which does not utilize circuit path means along exposed substrate surface portions.

It is further desired to embed a conductive plane within a molded circuit substrate to which certain conductive areas along the major surfaces are electrically connected, to interconnect and common a plurality of such conductive areas.

SUMMARY OF THE INVENTION

The present invention comprises a thin planar metal member embedded within a molded plastic substrate, defining upper and lower plastic layers about a metal layer. The plastic layers are joined to each other at integral column joints extending through apertures or slots in the metal member, or about the peripheral edge thereof, since bonding agent is not desired to be used. At least one location along a major substrate surface includes an aperture through a plastic layer extending inwardly to the metal layer, and after the side walls and periphery of the aperture are plated a plated via hole is defined which electrically connects a circuit path on the surface to the embedded metal layer. Beside each such via hole location and preferably on opposing sides thereof and slightly spaced therefrom are holes through the metal layer through which column joints of plastic material extend, joining the upper and lower plastic layers together at the via hole location. Such column joints assure that no microscopic separation occurs of the plastic layers from the metal layer at the plated via hole after plating, thus assuring that microcracks will not be formed in the plating material as a result of handling of the substrate.

Preferably other column joints are spaced around the substrate to likewise secure the plastic layers to each other through the metal layer, and optionally the plastic layers may also be joined to each other around at least most of the peripheral edge of the metal member. Optionally large diameter holes extend through the metal member at locations desired to become plated through-holes extending from one major surface to the other, so that upon molding plastic through the large diameter holes, smaller holes are defined having plastic side walls then plated to define the plated through-holes which are thus insulated from the embedded metal layer, and the plastic side walls also serve to join the plastic layers together. Other plated through-holes may be desired which establish an electrical connection from a surface circuit path to the metal layer, in which case holes through the metal layer have a diameter just smaller than the corresponding holes through the upper and lower plastic layers thereat so that edges of the metal layer are exposed to be plated by the plating material of the side walls of the holes through the upper and lower plastic layers.

One embodiment of the invention comprises a paddle board having signal circuit paths on the major surfaces extending from wire-termination pads along a cable-proximate edge of the substrate to terminal-connecting pads along a connector-proximate edge, for electrically connecting signal conductor wires of a ribbon cable to signal terminals of a connector. The embedded metal layer comprises a ground plane; ground circuit path segments extend from ground wire-terminating pads to plated via holes extending inwardly to the ground plane; near the connector-proximate edge at least one plated via hole extends from the ground plane to a ground terminal-connecting pad for electrically connecting all of the ground wires of the ribbon cable to at least one ground terminal at any desired terminal location, without interfering with signal circuit paths along the major substrate surfaces. The signal paths can extend from one major surface to the other through the metal layer utilizing plated through-holes insulated from the metal layer, for electrically connecting certain signal wire-termination pads with signal terminal-connecting pads disposed on the other major surface.

Another embodiment of paddle board with a buried ground plane contains two wire-receiving regions for receiving respective ones of two ribbon cables to be terminated thereto. The ground wires of both cables are electrically connected to the buried ground plane by plated via holes, and one or two ground path segments near the terminal-connecting regions of either or both major surfaces extend to ground terminal-connecting pads to provide electrical connections to ground terminals of the connector.

Another embodiment of circuit board utilizes a pair of embedded metal layers spaced apart by a layer of insulation, for providing power bussing to locations of electrical components mounted on the substrate. First via holes can extend to the near layer for electrical connection therewith; second via holes can extend through larger diameter holes in the near metal layer and the central dielectric layer for electrical connection with the far layer. Column joints are provided adjacent each such plated via hole through both metal layers and the central dielectric layer. Electrical connection to the far layer can also be provided by a plated through-hole extending completely through the circuit board, isolated from both embedded layers by side walls of the plastic layers extending through a larger diameter hole through bot metal layers and the insulative layer, and a path segment along the opposing major surface extending to a plated via hole extending to the far metal layer from the opposing major surface.

It is an objective of the present invention to provide at least one embedded metal layer for a molded circuit board which disallows separation of the plastic layers therefrom by using integral mechanical means and which protects the integrity of the plating material of plated via holes extending from a major surface to a metal layer for electrical connection therewith.

Embodiments of the invention will now be described with reference to the accompanying drawings.

BRIEF DESCRIPTION OF THE DRAWINGS

FIG. 2 is a perspective part section view of a paddle board similar to that of FIG. 1 for a pair of ribbon cables, having a metal member of the present invention embedded within upper and lower plastic layers;

FIG. 3 is a plan view of the metal member prior to embedment within the plastic layers, for the paddle board of FIG. 1;

FIG. 4 is a plan view of the paddle board of FIG. 1 prior to plating, with via holes and through-holes shown, with column joints shown in phantom adjacent the via holes and edge portions and at selected other locations;

FIG. 5 is an enlarged cross-sectional view through a substrate including the embedded circuit layer of the invention, showing two types of plated via hole locations and two types of plated through-hole locations, and substrate edges; and FIG. 6 is an enlarged cross-sectional view similar to FIG. 5 through a second embodiment of substrate having two metal layers having therebetween a layer of insulation for power bussing.

DETAILED DESCRIPTION OF THE PREFERRED EMBODIMENT

Figure 1:
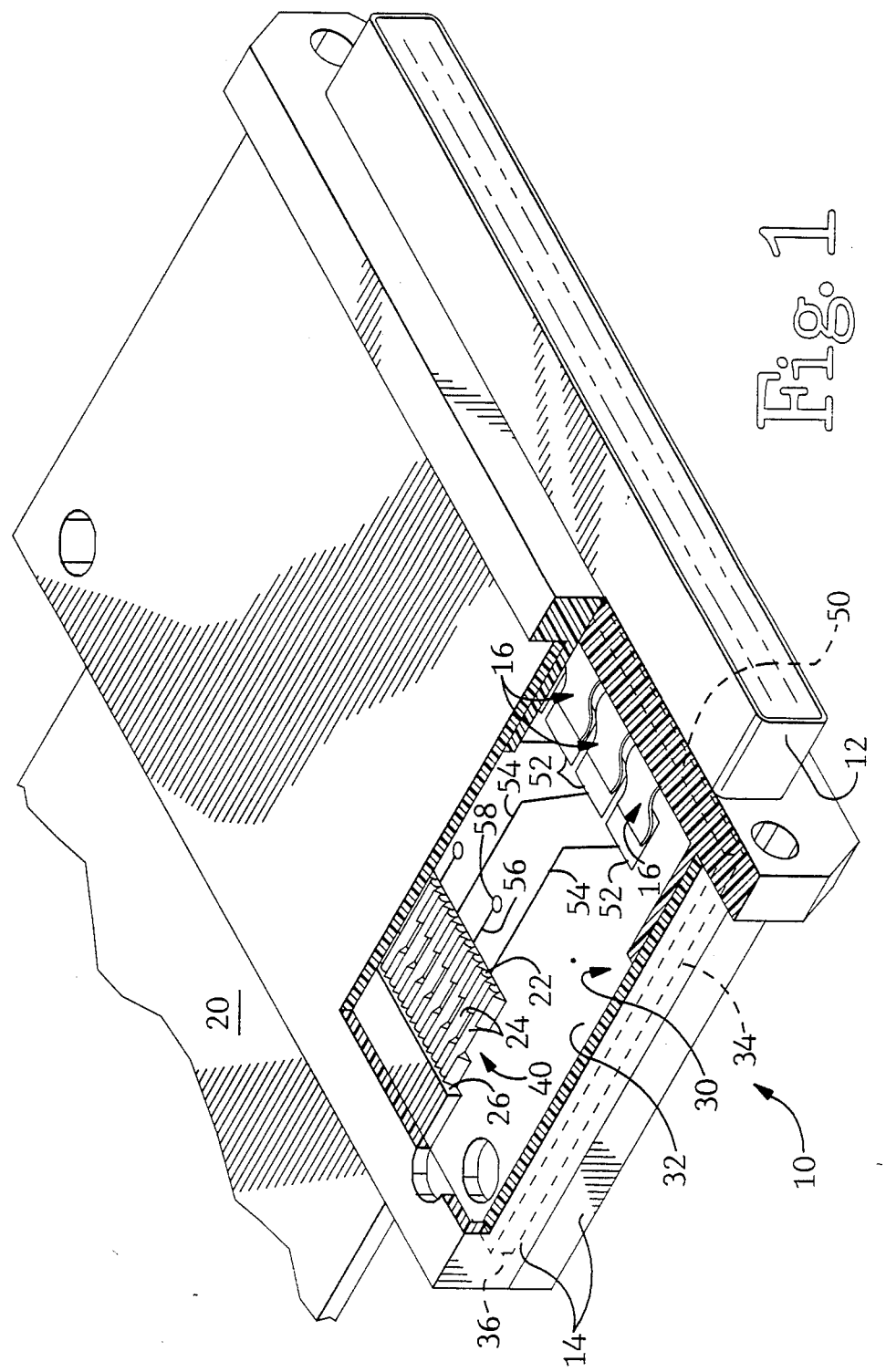
FIG. 1 is a perspective view of a transition connector for terminating ribbon cable with a portion broken away.

A transition connector 10 is illustrated in FIG. 1 having a housing 12 and covers 14 fastened thereto, with housing 12 having terminals 16 therein, and including a paddle board 30 of the present invention having circuitry thereon for electrically connecting terminals 14 with respective conductors 22,24 of ribbon cable 20. Paddle board 30 is of the type disclosed in U.S. Pat. No. 4,871,319.

In FIGS. 1 and 2 paddle boards 30,30A include upper and lower major surfaces 32,34 and a cable-proximate edge 36 including therealong a cable-receiving recess. Paddle board 30 has a wire-terminating region on upper major surface 32, and paddle board 30A includes wire-terminating regions on both upper and lower major surfaces 32,34 for a pair of ribbon cables (not shown). Each wire-terminating region 40 forwardly of cable-receiving recess 38 includes an array of alternating wire-termination pads 42,44 corresponding to signal conductors 22 and ground conductors 24, and pads 42,44 are disposed along bottoms of grooves 46 defined between serrate ridges 48 which serve as an integral wire-alignment mechanism for the paddle board to assist wire location for soldering during termination.

Along connector-proximate edge 50 are disposed, along both upper and lower major surfaces 32,34, terminal-connecting pads 52 which will be connected to respective ones of terminals 16 such as by soldering.

Signal circuit paths 54 extend along upper major surface 32 and electrically connect signal wire-termination pads 42 to signal ones of terminal-connecting pads 52 along upper surface 32. Signal circuit paths 56 (FIGS. 1 and 5) extend along upper major surface 32 from respective ones of signal wire-termination pads 42 to plated through-holes 58 which extend through substrate 30 to lower major surface 34, as seen in FIG. 5, and signal circuit paths 60 extend from plated through-holes 58 along lower major surface 34 to respective signal ones of terminal-connecting pads 52.

In FIG. 2 ground circuit paths 62 extend rearwardly from wire-termination pads 44 to plated via holes 64 which extend into substrate 30 to electrically connect to buried or embedded ground bus 100, for both embodiments of paddle boards 30,30A. Ground bus 100 has substantial length and width dimensions and can coextend under most or substantially all of the area of the major surfaces of substrate 30, if desired. Buried ground bus 100 allows practically all of the major surfaces to be utilized for signal circuit paths from the wire conductors of the cable or cables, to the terminal-connecting pads for connecting to the terminals of the connector. Buried ground bus 100 also has impedance benefits in that it serves to eliminate cross-talk between signal paths of the opposing major surfaces, especially if a pair of cables are to be terminated by a transition adapter 30A. Plated via holes 64a also extends outwardly from ground bus 100 to a ground circuit path segment 62a along both upper and lower major surfaces 32,34 which then extend forwardly to a terminal-connecting pad (not shown) for a ground terminal.

In FIG. 3 metal member 100a including the embedded ground bus may be stamped of sheet metal stock such as dead soft copper having a thickness of 0.005 inches. The circuit member may also be photoetched from a sheet of dead soft copper foil having a thickness of 0.005 inches or less, for example. Metla member 100a includes first holes 102, second holes 104, third holes 106 and fourth holes 108 at various selected locations. Along ultimate circuit member edge 110 are a series of slots 112 generally disposed along the ultimate periphery of ultimate circuit member 100. First holes 102 are preferably associated in pairs close to and on opposite sides of each site 114 (shown in phantom) to become a plated via hole 64,66 in the molded substrate, and as shown may comprise rectangular slots. Second holes 104 are larger in diameter than the ultimate plated through-holes desired to extend between signal circuit paths along first and second major surfaces 32,34 and are located at positions to become plated through-holes 58 insulated from metal member 100. Third holes 106 are located at selected positions remote from holes 102,104 to provide for fasteners such as bolts or rivets securing connector covers 14 to the substrate upon connector assembly 10. Fourth holes 108 are optional and are located to provide additional column joints. Links 130 join the ultimate circuit member 100 to carrier strips 132 used to facilitate handling and molding of substrate 30, after which links 130 are severed and carrier strips 132 removed (FIG. 4). A plurality of circuit members 100 may be stamped or etched from a single sheet in this manner, and may be used in conjunction with a multicavity mold (not shown) to mold simultaneously a plurality of substrates 30.

Referring to FIG. 4, unplated member 70 has been fabricated by molding upper and lower plastic layers 72,74 along upper and lower surfaces of metal member 100a without the use of bonding agents, mold release agents or other materials which would be detrimental to eventual plating or the establishment of electrical connections with ultimate circuit member 100. Layers 72,74 may be for example about 0.030 inches thick each. Upper and lower layers 72,74 are mechanically joined to each other at peripheral edge joints 76, and at column joints 78 and by side walls of apertures 80 comprising plastic tubes extending through large diameter second holes 104 of metal member 100. Column joints 78 also extend through third holes 106 of metal member 100 integrally joining upper and lower plastic layers 72,74 as do edge joints 76. Apertures 82 extend into one of the plastic layers 72,74 to metal surface portions 114 to become sites of via holes 64,66.

Referring to FIGS. 4 and 5, column joints 78 extend through first holes 102 in the vicinity of apertures 82, at least in pairs spaced closely to exposed metal surface portions 114. Where apertures 82 are disposed close to the peripheral edge 110 of circuit member 100, the peripheral edge joint 76 may serve as one of the pair of column joints in association with a column joint 78. Apertures 82 extend through either the upper layer 72 or the lower layer 74 to an upper surface or a lower surface of circuit member 100 respectively.

Referring to FIG. 5 apertures 82 when plated with plating material 120 become plated via holes 64,66 electrically connected by the plating material 120 to the metal circuit layer 100. Side walls 84 of apertures 84 preferably are slightly tapered to a smaller diameter adjacent metal member 100 to facilitate plating and also to facilitate withdrawal of core pins of the mold apparatus utilized to mold plastic layers 72,74 to metal member 100. Plating material 120 extends along side wall surfaces 84 and exposed surface portions 114 of metal member 100, and includes annular portions 122 around the periphery of each aperture 82 to which extend and connect one or more circuit paths 62,68 along major substrate surface 32,34.

Aligned apertures 86 are defined by side walls 88 of plastic material extending through large diameter second holes 104 of metal member 100 joining upper and lower plastic layers 72,74 together and when plated define plated through-holes 58 which are electrically isolated from metal circuit layer 100, joining signal circuit paths 56,60 along first and second major surfaces 32,34 of substrate 30. Although not utilized in the paddle boards of FIGS. 1 to 4, aligned apertures 90 may extend through upper layer 72 and lower layer 74 aligned with holes 116 of metal circuit layer 100, and edge portions 118 of metal member 100 are exposed so that upon plating the plating material 120 covers side walls 92 of apertures 90 and the exposed metal edges 118 defining plated through-holes 94 which are electrically connected to metal circuit layer 100. Preferably adjacent each site of such apertures 90 are disposed pairs of column joints 96 extending through respective ones of first holes 102 through metal circuit layer 100 to prevent local delamination of plastic layers 72,74 from metal layer 100 during handling which otherwise may result in microcracks in plating material 120. As with apertures 82, apertures 86,90 preferably have tapered side walls 88,92 to facilitate plating and the molding process.

FIG. 6 illustrates another embodiment of substrate 200 in which a pair of metal layers 212,214 are utilized to provide power bussing to components 202 on the substrate. A layer of insulation 216 is disposed between the metal layers. Upper and lower plastic layers 218,220 are disposed on outwardly facing surfaces of metal layers 212,214 respectively. Metal layers 212,214 with insulation layer 216 therebetween is fabricated as a unit prior to molding upper and lower plastic layers 218,220 thereto. Lead 204 of component 202 is soldered to a circuit path 206 and electrically connected to near metal layer 212 having positive voltage such as +5 VDC from a connection to a corresponding power source (not shown), by plated via hole 222; column joints 224 are located adjacent thereto extending through layers 212,214,216 or therepast at a peripheral edge, joining plastic layers 218,220 to protect the integrity of the plating material. Lead 208 of component 202 is soldered to circuit path 210 and electrically connected by plated via hole 226 to far metal layer 214 having negative voltage −5 VDC from a corresponding connection to a power source (not shown); plated via hole 226 has preferably tapered side walls 228 extending through larger diameter holes 230 through near metal layer 212 and insulation layer 216 to exposed surface portion 232 of far metal layer 214; column joints 234 are located adjacent thereto extending through layers 212,214,216 joining plastic layers 218,220 to protect the integrity of the plating material of plated via hole 226.

Also in FIG. 6, another means of electrical connection to both metal layers for power is attained by a conventional plated through-hole 236 extending completely through both metal layers 212,214 and through insulative layer 216 from the upper major surface 238 to the lower major surface 240, similar to plated through-hole 58 of FIG. 5. Plated through-hole 236 connects path segment 242 along upper surface 238 to which lead 244 of component 246 is soldered, to path segment 248 along lower major surface 240 which extends to plated via hole 250 which then extends into lower layer 220 to electrically connect with far metal layer 214. Lead 252 electrically connected to near metal layer 212 by a path segment 206 and plated via hole 222. Substrate 200 may have other circuit paths on surfaces thereof, as in the embodiment of FIGS. 1 to 4, and also include other column joints as substrate 30.

Such circuit substrates may be molded of plastic material such as for example of glass-filled polyethersulfone resin sold under the trade designation VICTREX by ICI Americas, Wilmington, Del., or such as ULTEM polyetherimide resin sold by General Electric Company, Pittsfield, Mass. All exposed surface portions are then treated for adhesion promotion and are coated with an ultraviolet light sensitive catalyst as described in U.S. Pat. No. 4,511,597. A masking means opaque to ultraviolet light is then placed over all surfaces of the molded plastic member which are intended to remain nonconductive. All unmasked surfaces of the catalyzed and masked plastic member including through-holes and via holes are exposed to ultraviolet light of appropriate actinic wavelength and energy level to activate the catalyst on the exposed surface areas to render the catalyzed areas receptive to plating of a metal layer thereonto. The masking means is then removed. The catalyst-activated areas are plated such as by electroless plating, or electroplating or a combination thereof as conventionally known, with a first layer of copper about 0.0014 inches thick. A second layer of tin about 0.0002 inches thick is then plated onto the first layer. The plated substrate thus formed may then be subjected to baking or other post-curing restoration steps and cleaning steps if desired.

It may be desirable during production of substrates such as those of the embodiment shown in FIGS. 1 to 4 to retain a plurality of metal members 100 on a single sheet of metal while respective plastic upper and lower layers are molded thereto to facilitate handling. In such a process each metal member 100 can be joined to the sheet by a plurality of links between elongate slot portions through the sheet which define peripheral edges 110 of the ultimate circuit member, with plastic material extending through the slots to form joints. After molding the plurality of substrates still joined to the sheet, the links are severed preferable flush with the outer surfaces of the molded plastic substrates.

Production of the substrates 200 of FIG. 6 may utilize one such metal sheet with far layers 214 for example having their appropriate hole patterns, and at several locations remote from via hole sites bond separate layers 216 thereto having appropriate hole patterns to layers 214, then similarly bond thereover near metal layers 212 to insulative layers 216. The assembly can be then handled as with the sheet for fabrication of the first embodiment.

The skilled artisan may devise variations and modifications to the preferred embodiment described herein to adapt the invention to various situations and purposes, and such variations and modifications are within the spirit of the invention and the scope of the claims.

What is claimed is:

1. A molded circuit substrate having at least one embedded metal layer therewithin electrically connected to selected circuits of circuitry disposed on major substrate surfaces, each at least one metal layer comprising a metal disposed between upper and lower plastic layers and having substantial length and width with respect to the substrate, a plurality of joints at a plurality of locations defined by plastic material molded to extend past edge portions of said metal member and integrally join together said upper and lower plastic layers, at least one of said upper and lower plastic layers including conductive circuit paths plated onto an outwardly facing major surface thereof, at least one of said circuit paths being electrically connected to the embedded metal layer by plating material along side walls of a respective first aperture through one of said upper and lower plastic layers at a first connection site extending to an exposed surface of said metal layer, at least a pair of said joints being disposed on respective substantially opposed sides of said connection site and closely spaced thereto, whereby said metal layer underlies a substantial portion of said major surfaces enabling a corresponding substantial range of possible locations for said first connection site and said upper and lower plastic layers are joined together against said metal layer at said connection site by said pair of joints on substantially opposing sides of said first connection site irrespective of the location thereof, thereby minimizing possible delamination of said plastic layers from said metal layer and possible resulting cracking of said plating material at said connection site.

2. A molded circuit substrate as set forth in claim 1 wherein each said first aperture is defined by inwardly tapered side walls facilitating plating thereof with said plating material.

3. A molded circuit substrate as set forth in claim 1 wherein selected said joints are column joints comprising columns of said plastic material extending through holes in said metal member.

4. A molded circuit substrate as set forth in claim 3 wherein at least one said joint of said pair of joints adjacent a said connection site is a said column joint.

5. A molded circuit substrate as set forth in claim 1 wherein said upper and lower plastic layers are joined together along peripheral edge portions of said metal layer, defining peripheral joints.

6. A molded circuit substrate as set forth in claim 5 wherein one said joint of said pair of joints adjacent a said connection site is a said peripheral joint.

7. A molded circuit substrate as set forth in claim 1 wherein associated said circuit paths are disposed on outwardly facing surfaces of said upper and lower plastic layers are electrically connected to each other and electrically isolated from said metal layer by a plated through-hole comprising aligned second apertures through said upper and lower plastic layers having a selected dimension and shape and including plastic walls extending through a larger hole through said metal member, with side wall surfaces of said aligned second apertures and said plastic walls being plated.

8. A molded circuit substrate as set forth in claim 7 wherein said second apertures have inwardly tapering side wall surfaces.

9. A molded circuit substrate as set forth in claim 1 wherein associated others of said circuit paths are disposed on outwardly facing surfaces of said upper and lower plastic layers are electrically connected to each other and to said embedded metal layer by plating material along side walls of respective aligned third apertures through both said upper and lower plastic layers extending to exposed edge portions of a corresponding hole through said metal layer, the side wall surfaces of said aligned third apertures and said exposed edge portions being plated by said plating material, at least a pair of said joints being disposed on respective substantially opposed sides of said metal layer hole and closely spaced thereto.

10. A molded circuit substrate as set forth in claim 9 wherein said said third apertures have inwardly tapering side wall surfaces.

11. A molded circuit substrate as set forth in claim 9 wherein said corresponding hole of said metal layer has a diameter just less than the diameters of said aligned third apertures, whereby said exposed edges extend slightly inwardly from side wall surfaces of said third apertures prior to plating.

12. A molded circuit substrate as set forth in claim 1 having two metal layers embedded therein, further including a central layer of insulative material between said two metal layers, wherein said joints of plastic material integral with said upper and lower plastic layers extend past edge portions of said two metal layers and said central layer of insulative material.

13. A molded circuit substrate as set forth in claim 12 wherein at least one plated via hole extends from a selected major surface through a larger diameter hole in a near one of said metal layers and insulated therefrom, through said central insulative layer, and is electrically connected by plating material to an exposed surface portion of a far one of said metal layers, each said at least one said plated via hole includes adjacent thereto a pair of said joints spaced closely thereto joining said upper and lower plastic layers.

* * * * *